(12) United States Patent
John et al.

(10) Patent No.: US 11,640,975 B2
(45) Date of Patent: May 2, 2023

(54) SILICIDED COLLECTOR STRUCTURE

(71) Applicant: NXP USA, INC., Austin, TX (US)

(72) Inventors: Jay Paul John, Chandler, AZ (US);
James Albert Kirchgessner, Tempe, AZ (US); Ljubo Radic, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/350,040

(22) Filed: Jun. 17, 2021

(65) Prior Publication Data

US 2022/0406906 A1    Dec. 22, 2022

(51) Int. Cl.
| *H01L 29/417* | (2006.01) |
| *H01L 29/45* | (2006.01) |
| *H01L 29/66* | (2006.01) |
| *H01L 29/40* | (2006.01) |
| *H01L 29/735* | (2006.01) |

(52) U.S. Cl.
CPC ...... *H01L 29/41708* (2013.01); *H01L 29/401* (2013.01); *H01L 29/45* (2013.01); *H01L 29/6625* (2013.01); *H01L 29/735* (2013.01)

(58) Field of Classification Search
CPC ............... H01L 29/6625; H01L 29/735; H01L 29/41708; H01L 29/66234; H01L 29/73; H01L 29/66242; H01L 2924/13051; H01L 29/737–7378; H01L 29/66318
See application file for complete search history.

(56) References Cited

U.S. PATENT DOCUMENTS

| 6,066,520 | A | 5/2000 | Suzuki |
| 7,002,190 | B1 | 2/2006 | Geiss et al. |
| 7,135,757 | B2 | 11/2006 | Stengl et al. |
| 7,456,071 | B2 | 11/2008 | Marty et al. |
| 7,491,985 | B2 | 2/2009 | Geiss et al. |
| 2010/0117237 | A1 | 5/2010 | Coolbaugh et al. |
| 2014/0239498 | A1* | 8/2014 | Coolbaugh ....... H01L 21/28518 257/741 |
| 2015/0108548 | A1* | 4/2015 | Dunn .................... H01L 29/732 438/318 |
| 2016/0043203 | A1 | 2/2016 | Alperstein et al. |

OTHER PUBLICATIONS

Bain, M., "SiGe HBTs on Bonded SOI Incorporating Buried Silicide Layers", IEEE Transactions on Electron Devices, vol. 52, No. 3, Mar. 2005.

* cited by examiner

*Primary Examiner* — Wasiul Haider
(74) *Attorney, Agent, or Firm* — David G. Dolezal

(57) ABSTRACT

A semiconductor device includes an emitter, a base, and a collector. A portion of the collector is located below a trench in a substrate. A collector silicide is located on at least a portion of a bottom portion of the trench and on at least a portion of a sidewall of the trench. The collector silicide structure is electrically coupled to a collector contact structure.

17 Claims, 7 Drawing Sheets

SILICIDED COLLECTOR STRUCTURE

BACKGROUND OF THE INVENTION

Field of the Invention

This invention relates in general to semiconductor devices.

Description of the Related Art

Semiconductor devices such as bipolar transistors include an emitter, a collector, and a base. Some types of bipolar transistors can be used for high speed switching applications.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a semiconductor device includes an emitter, a base, and a collector. A portion of the collector is located below a trench in a substrate. A collector silicide is located on at least a portion of a bottom portion of the trench and on at least a portion of a sidewall of the trench. The collector silicide structure is electrically coupled to a collector contact structure. In some embodiments, forming a collector silicide structure on a bottom portion and on a sidewall of a trench in a substrate may allow for a lower path resistance from the collector contact structure to the collector region/base region junction thereby reducing the series resistance of the collector.

Figure 1:
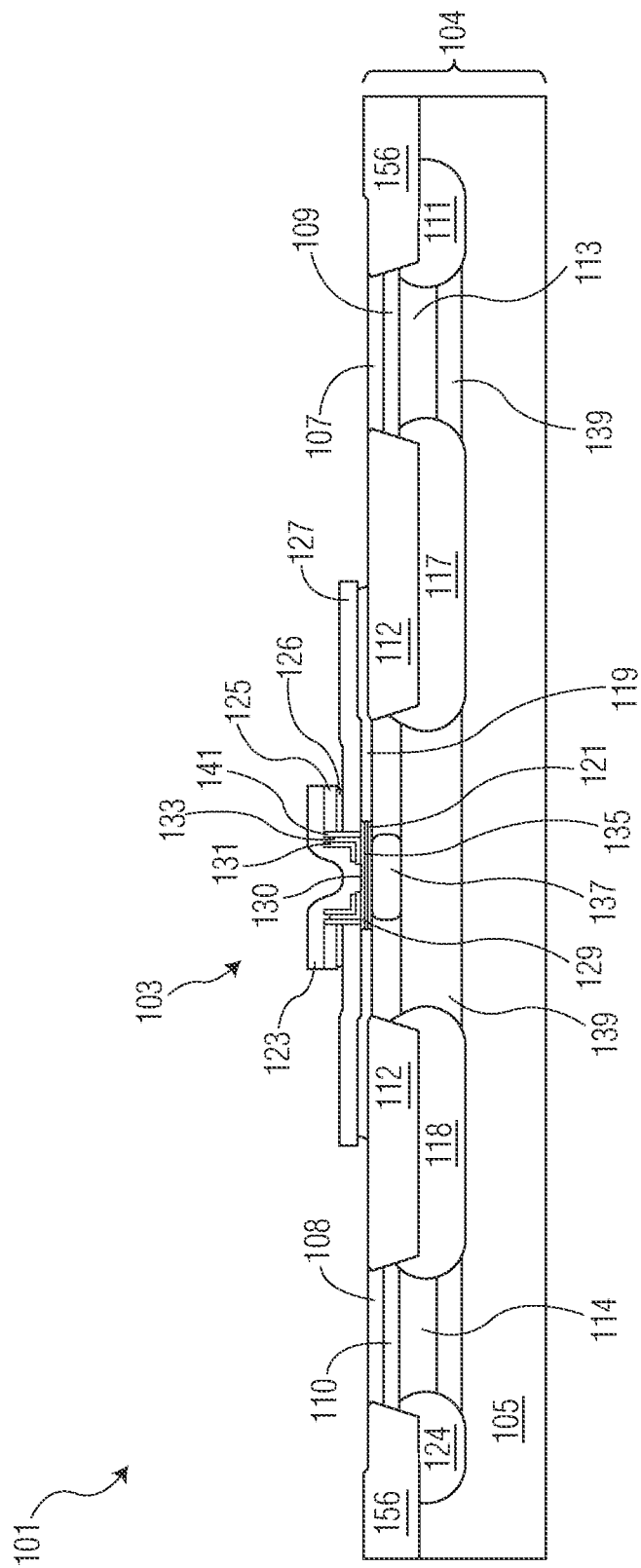
FIGS. 1-6 are partial cutaway side views of a wafer during various stages in the manufacture of a semiconductor device according to one embodiment of the present invention.

FIG. 1 is a partial cutaway side view of a wafer according to one embodiment of the present invention. Wafer 101 includes a semiconductor device 103. In the embodiment shown, semiconductor device 103 is an NPN bipolar transistor that includes an N type emitter region 130 located over a portion of a base of device 103. In one embodiment, emitter region 130 is implemented with a layer of silicon doped with an N type dopant (e.g. phosphorous, arsenic). In the embodiment shown, the base of device 103 includes an intrinsic base region located in a region 135 of P type doped silicon germanium. The base also includes two silicon regions 129 and 121 located above and below region 135 that are doped with P-type dopants (e.g. boron). Region 135 is electrically coupled to a poly silicon base electrode 127. Emitter electrode 123 is located over and is electrically coupled to emitter region 130 through an opening (an emitter window) defined by a nitride spacer 131 and an oxide spacer 133. Oxide 126 and nitride 125 insulate base poly silicon electrode 127 from the emitter polysilicon electrode 123.

In one embodiment, regions 129, 135, and 121 are implemented in one or more silicon and silicon germanium layers that are epitaxially grown on an underlying silicon layer 105, which are part of substrate 104. Region 130 is formed by N-type dopant diffusion from the emitter electrode 123 into region 129. Initially, layer 105 is doped with a relatively light concentration of P-type or N-type dopants. Trenches are formed in layer 105 which are then subsequently filled with oxide and planarized to form trench isolation structures 112 and 156. In the embodiment shown, trench structure 112 surrounds region 137 where a portion of trench structure 112 is on the right side of region 137 and a portion of trench structure 112 is on the left side of region 137, relative to the view shown in FIG. 1.

Several regions in layer 105 are doped with N-type dopants during different ion implantation operations to form portions of the collector such as collector well region 139, collector buried regions 117 and 118 that are located under trench isolation structure 112, collector buried regions 124 and 111 that are located under trench isolation structure 156, collector sinker regions 114 and 113, collector regions 110 and 109, and collector contact regions 108 and 107. The collector of device 103 includes an N-type doped silicon selectively implanted collector (SIC) region 137 that contacts region 121 of the base to form the collector base junction. The collector regions may have different doping concentrations which depend upon the doping concentrations and energies of the ion implantations operations that form them. In other embodiments, a collector may have a lessor or greater number of regions of different doping concentrations. For example, in some embodiments, regions 107 and 109 and regions 108 and 110 would have the same doping concentration.

In one embodiment, after the formation of trench isolation structures 112 and 156 and the formation of regions 108, 110, 114, 124, 118, 139, 117, 111, 113, 109, and 107, an oxide layer 119, a layer of poly silicon (which is later patterned to form base electrode 127), a layer of oxide (which is later patterned to form oxide 126), and a layer of nitride (which is later patterned to form nitride 125) are formed over wafer 101. The layer nitride (nitride 125), the layer of oxide (oxide 126), and the layer of polysilicon (electrode 127) are then patterned to form an opening to expose layer 119, After forming the opening, nitride spacers 141 are formed on the opening sidewalls. Oxide layer 119 is then isotropically etched after nitride sidewall formation to undercut the polysilicon layer of base electrode 127 to expose layer 105 for the epitaxial growth of the silicon and silicon germanium layers of regions 121, 135, and 129. In some embodiments, regions 121, 135, and 129 may be insitu doped as grown. In some embodiments, layer 105 may be implanted through the opening with N type dopants (e.g. arsenic, phosphorous) to form collector region 137.

After the formation of the silicon and silicon germanium layers for regions 121, 135, and 129, a second layer of oxide and a second layer of nitride are formed over substrate 104 and etched to form spacers 133 and 131, respectively. During such etches, an opening is formed in nitride spacer 131 and oxide spacer 133 to expose base region 129. A second layer of poly silicon is then formed over wafer 101 and patterned to form emitter electrode 123. During the formation of emitter electrode 123, portions of the layers of nitride 125 and oxide 126 are also patterned. Next, the base electrode 127 is formed by patterning Then, the remaining portions of oxide layer 119 are removed thereby exposing regions 108 and 107. Emitter region 130 is formed by N-type dopant diffusion from the emitter electrode 123 into region 129 during a final annealing step.

In one embodiment, from a top view, base electrode 127 surrounds emitter electrode 123. Collector contact region 107 has a form of a long strip that runs on one side of emitter electrode 123/base electrode 127 and contact region 108 would be of a similar size and located on the other side of emitter electrode 123/base electrode 127 relative to the view of FIG. 1. In one embodiment, collector contact regions 108 and 107 are each located in mesas of layer 105 that are defined by the trenches of isolation structures 112 and 156. In one embodiment, regions 108 and 107 would be electrically coupled together by conductive interconnect structures (not shown) located above substrate 104. In other embodiments, collector contact regions 107 and 108 would be individually bias able. In other embodiments, regions 108 and 107 would be the same region that surrounds the emitter electrode 123/base electrode 127. Semiconductor devices of other embodiments may have other regions, other structures, other configurations, and/or be made by other processes.

Figure 2:
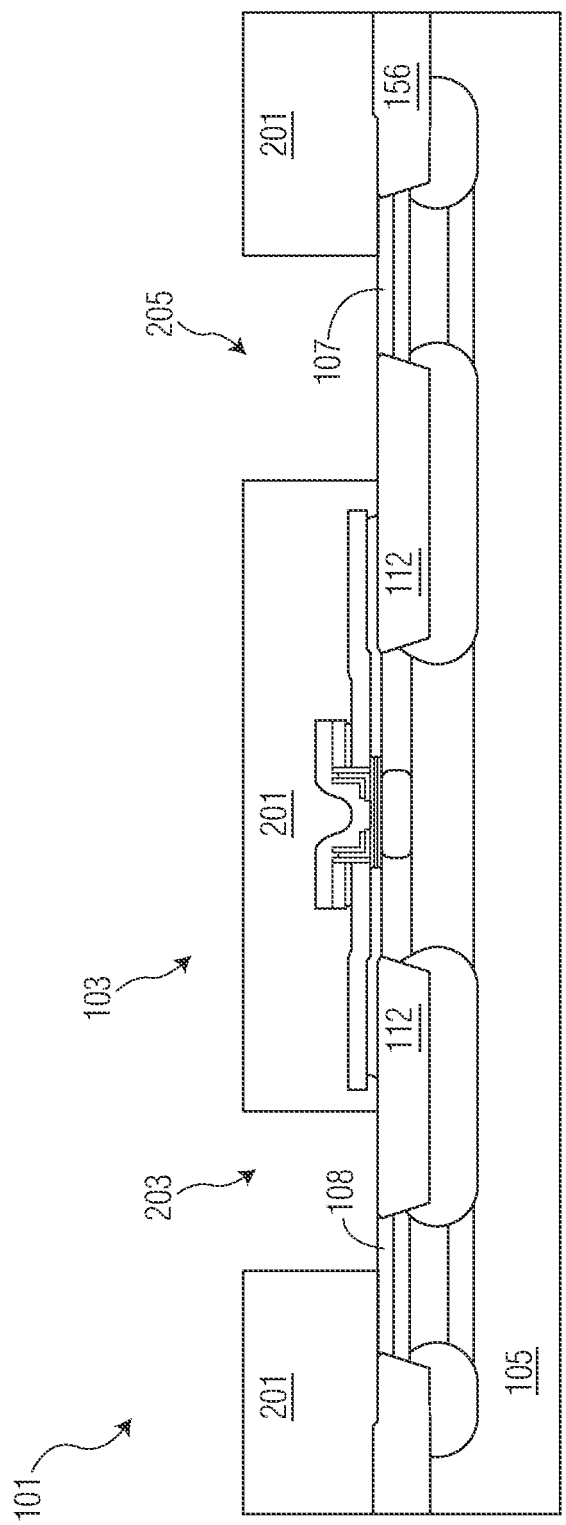

FIG. 2 is a partial cutaway side view of wafer 101 after a mask 201 is formed over wafer 101 that includes openings 203 and 205 to expose portions of trench isolation structure 112 including the outer sidewall. In one embodiment, mask 201 is made of photoresist.

Figure 3:
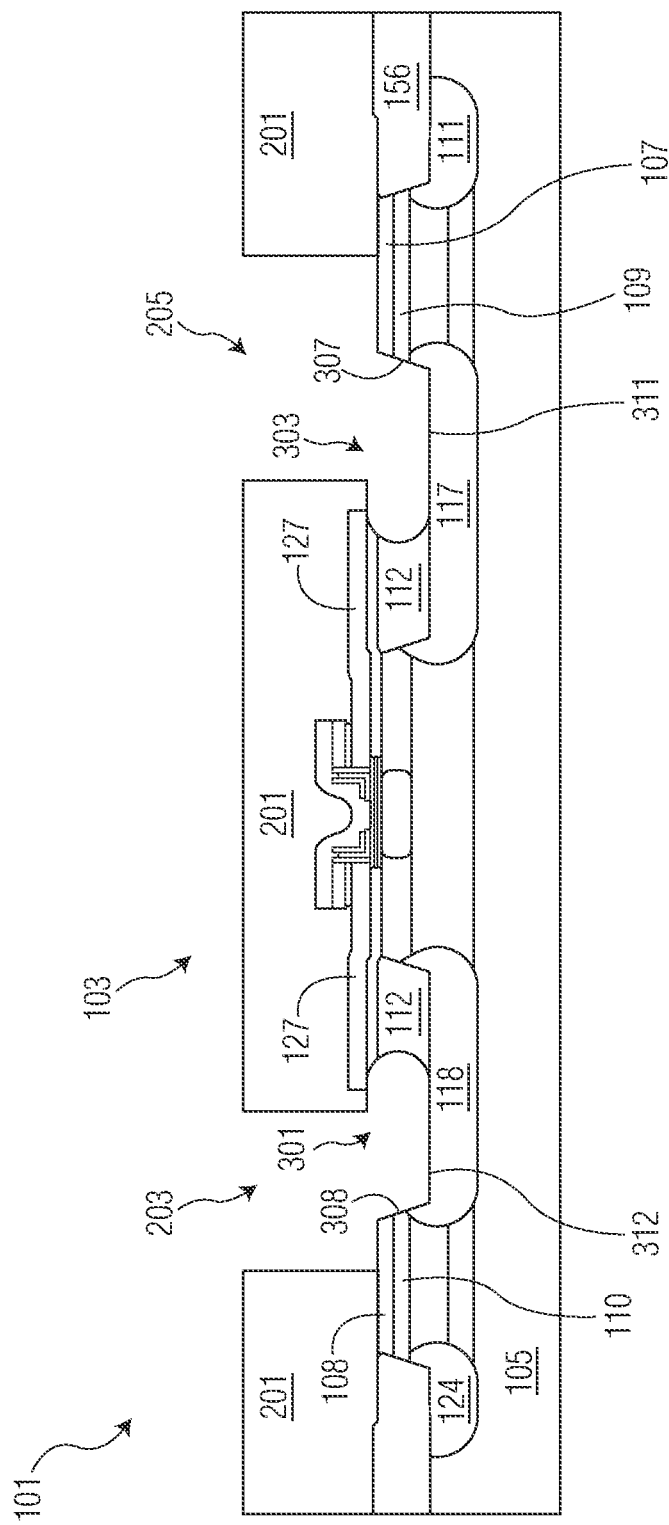

FIG. 3 is a partial cutaway side view of wafer 101 after portions of trench isolation structure 112 have been etched to form openings 301 and 303 in trench isolation structure 112. In one embodiment, portions 307 and 308 of the trench sidewall and portions 312 and 311 of the trench bottom are exposed such that portions of N type regions 108, 110, 118, 117, 109, and 107 of the collector are exposed. In one embodiment, the oxide portions of oxide structure 112 are etched with a wet etch chemistry of hydrofluoric acid (HF). However, in other embodiments, portions of structure 112 may be removed by other etch processes such as by a dry anisotropic etch or with a combination of dry and wet etches.

Figure 4:
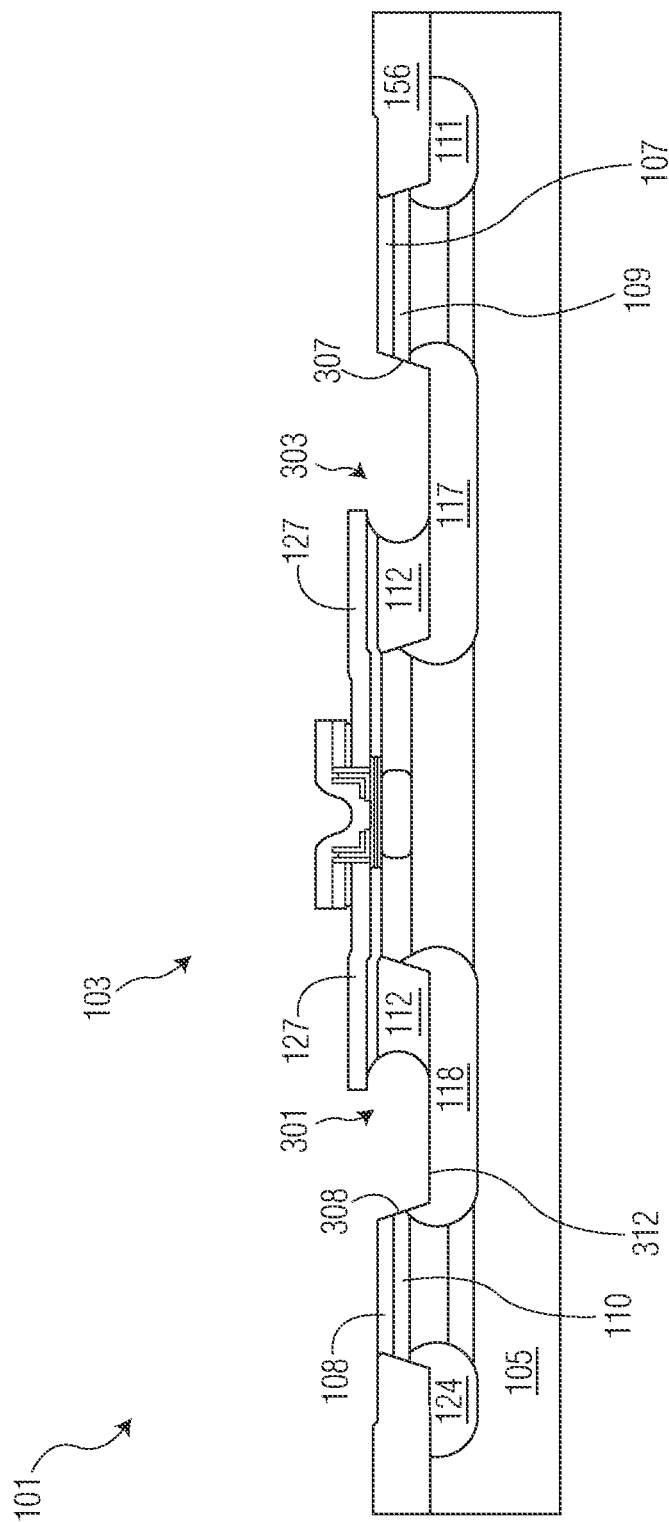

FIG. 4 shows wafer 101 after the removal of mask 201. During this time, other wafer cleaning processes may be performed on wafer 101.

Figure 5:
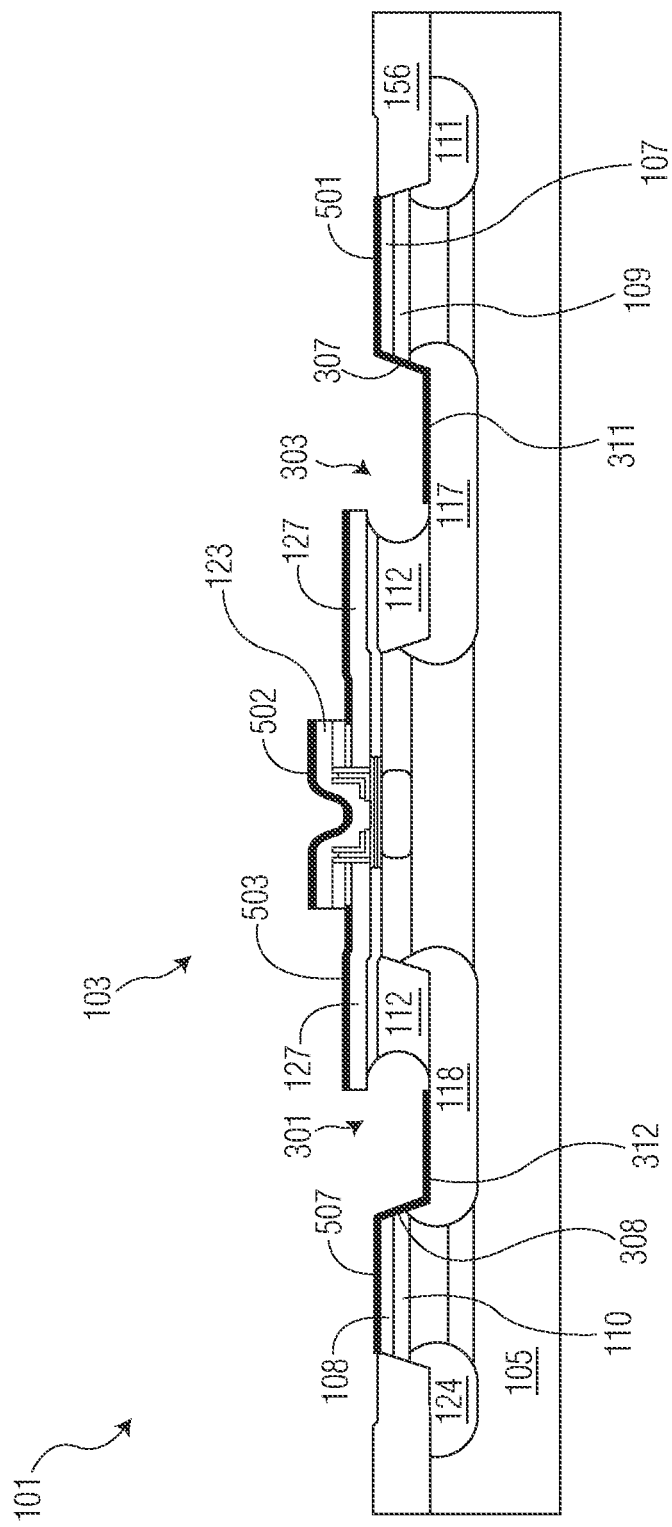

FIG. 5 shows wafer 101 after the formation of silicide on all exposed silicon surfaces. Emitter silicide structure 502 is formed on emitter electrode 123, and base silicide structure 503 is formed on base electrode 127. Collector silicide structure 507 is formed on the top surface of region 108, trench sidewall portion 308, and trench bottom portion 312. Collector silicide structure 501 is formed on the top surface of region 107, trench sidewall portion 307 and trench bottom portion 311. In one embodiment, silicide structures 507, 502, 503, and 501 are formed by depositing a layer of refractory metal (e.g. cobalt, nickel) on wafer 101. Wafer 101 is then annealed at a high temperature where the deposited metal reacts with the exposed silicon to form a silicide. A wet etch is preformed to remove the unreacted metal and then another anneal operation is performed. Silicide structures may be formed by other processes in other embodiments.

Figure 6:
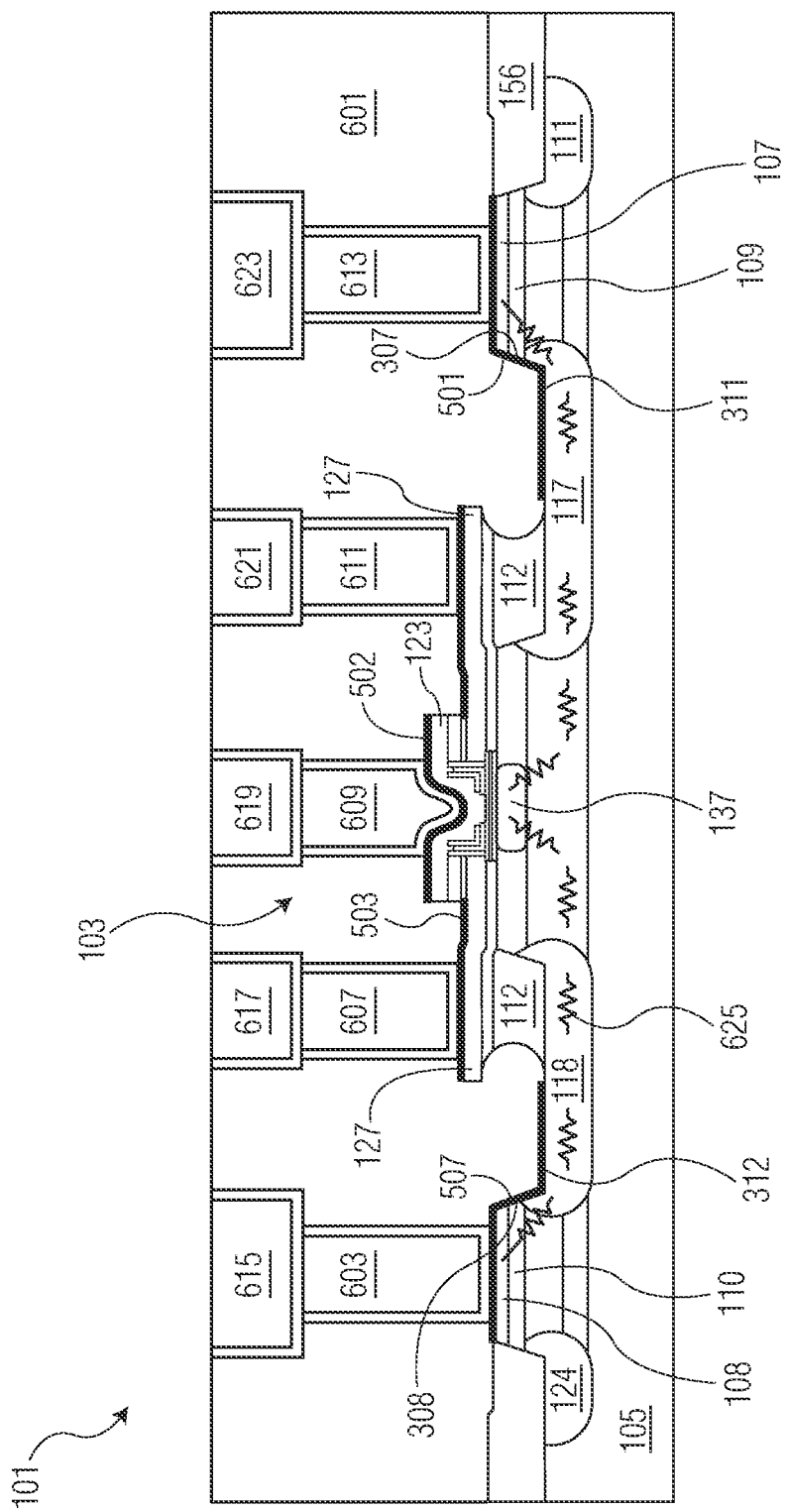

FIG. 6 is a partial cross section of wafer 101 at a later stage of manufacture. As shown in FIG. 6, collector contacts 603 and 613 are formed in electrical contact with collector silicide structures 507 and 501, respectively. Contacts 603 and 613 contact the collector silicide structures at locations outside of the trenches of the partially removed isolation structures 112 on a portion of substrate 104 at an elevation above the bottom of the trenches (e.g. on mesas of layer 105). Base contacts 607 and 611 electrically contact base silicide structure 503 and emitter contact 609 electrically contacts silicide structure 502. In one embodiment, contacts 603, 607, 609, 611, and 613 are made of one or more metals (e.g. tungsten, nickel) and may include a barrier layer (618) made of a barrier material (e.g. titanium, titanium nitride) that is initially deposited in openings prior to the tungsten or nickel. Conductive interconnect structures 615, 617, 619, 621, and 623 are then formed to contact the contacts. The conductive interconnect structures may be made of copper, gold, or aluminum. The contacts and conductive interconnect structures are insulated by dielectric 601 that may include one or more layers of deposited dielectric material (e.g. oxide, nitride). As shown in FIG. 6, dielectric 601 fills the remaining portions of the trenches after the formation of silicide structures 507 and 501. In one embodiment, the contacts, the conductive interconnect structures, and dielectric 601 are formed by the deposition, etching, and planarization of the various materials of those structures. In one embodiment, interconnect structures 615 and 623 would be electrically coupled together at higher level interconnect layers (not shown). In some embodiments where interconnect structures 615 and 623 are located in the final interconnect level, those structures may be coupled together at a lead frame level.

Shown in FIG. 6 are resistor symbols 625 that represent the resistance from collector contact region 108 to collector region 137 and from collector contact region 107 to collector region 137. Providing collector silicide structures 507 and 501 with portions that extend down the sidewall portions 308 and 307 and on bottom portions 312 and 311 may provide for a transistor that has a lower collector resistance due to the collector silicide structure providing a lower resistance path to portions of the collector regions (118, 117) located below the bottom portions of the trenches.

In some embodiments, providing collector silicide structures with portions that extend towards the collector/base interface may allow for the collector contacts 603 and 613 to be placed farther away from collector region 137 and still provide the same collector resistance. Accordingly, device 103 can have a lower collector resistance while still maintaining the same contact spacing between the collector contacts (603, 613) and contacts (607 and 611) adjacent to those contacts.

Furthermore, providing a collector silicide portion to be located on a portion of the sidewall of a trench allows for the collector contacts (603 and 613) to be located at higher elevations of substrate 104 (e.g. above contact regions 108 and 107) than at lower elevations at the bottom portions 312 and 311 of the trenches. Accordingly, the formation of the contacts (603, 607, 609, 611, and 613) is less challenging in that the bottom surfaces of the contacts are closer to the same elevation than if the collector contacts were located at the bottom portions (312, 311) of the trenches.

One advantage of the processes shown in FIGS. 1-6 is that the collector silicide structures 507 and 501 can be formed with extended portions in the trench by only making minor modifications to the processes for forming a transistor. For example, from the stage shown in FIG. 1 where the collector, base and emitter have been formed, only the addition of the processes illustrated in FIGS. 2, 3, and 4 (mask formation, trench isolation etching, and mask removal) are utilized to provide a collector silicide structure (507, 501) with extensions into the trench.

After the stage of manufacture shown in FIG. 6, subsequent processes may be performed on wafer 101. For example, upper interconnect layers (not shown) may be formed on top of wafer 101 and include conductive structures electrically coupled to the collector, emitter, and/or base of device 103 as well as to other devices formed on wafer 101. Afterwards, wafer 101 is singulated into multiple integrated circuits each with at least one device similar to device 103. Afterwards, the integrated circuits are protected in semiconductor packages that can be implemented in electronic systems such as communications devices, motor controllers, or automotive electronics systems. In one example, device 103 is used as a power amplifier to amplify a received RF signal, for example as used in a cellular telephone.

Figure 7:
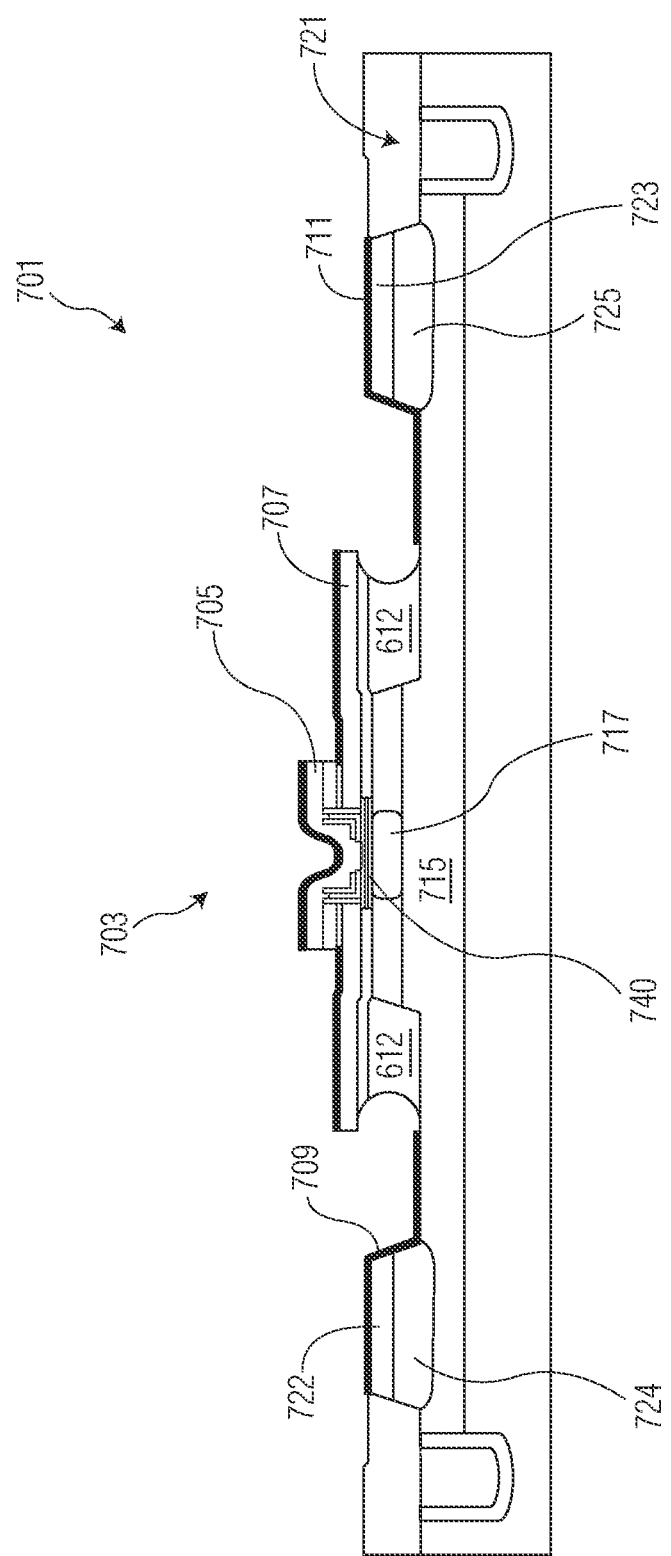
FIG. 7 is a partial cutaway side view of a wafer at a stage in the manufacture of a semiconductor device according to another embodiment of the present invention.

A collector silicide structure described above can be utilized in transistors having other configurations. For example, FIG. 7 shows a partial cutaway side view of wafer 701 during a stage of its manufacture. Wafer 701 includes an NPN transistor 703 having a silicided emitter electrode 705, a silicided base electrode 707, and collector silicide structures 709 and 711 for biasing the collector of transistor 703. In the embodiment of FIG. 7, the collector of transistor 703 includes N type doped collector contact regions 722 and 723, sinker regions 724 and 725, a buried collector region 715, and a silicon selectively implanted collector (SIC) region 717 that abuts a multi-region base 740 to form the collector base junction. A deep trench isolation structure 721 surrounds transistor 703. In other embodiments, the emitter, base, and/or collector regions may be formed in other ways, have other regions, and/or have other configurations.

In still other embodiments, a transistor with an extended collector silicide structure may have other configurations. For example, the collector silicide structure may extend further towards the base/collector junction depending upon the amount of oxide etched under the polysilicon base electrode (127, 707). In some embodiments, the silicide structure may extend up on a portion of the opposite side wall of the trench. In still other embodiments, a shallow trench isolation structure may be a multi-layer structure where the different layers are etch selectable with respect to each other to allow for the underlying layer of the trench isolation structure to be isotropically etched with respect to the upper layers of the trench isolation structure. Although the transistors described above are NPN transistors, an extended collector silicide structure could also be implemented with a PNP transistor.

As disclosed herein, a first structure is "directly over" a second structure if the first structure is located over the second structure in a line having a direction that is perpendicular with a generally planar major side of the wafer. For example, in FIG. 1, electrode 123 is directly over region 137. Electrode 123 is not directly over region 107. As disclosed herein, a first structure is "directly beneath" or "directly under" a second structure if the first structure is located beneath the second structure in a line having a direction that is perpendicular with a generally planar major side of the wafer. For example, in FIG. 1, region 137 is directly beneath emitter electrode 123. Region 113 is not directly beneath electrode 123. One structure is "directly between" two other structures in a line if the two structures are located on opposite sides of the one structure in the line. For example, in FIG. 1, region 137 is located directly between regions 110 and 109 in a line in the cut away side view of FIG. 1. Emitter electrode 123 is not located directly between regions 110 and 109 in a line. A first structure is "directly lateral" to a second structure if the first structure and second structure are located in a line having a direction that is parallel with a generally planar major side of the wafer. For example, regions 114 and 113 are directly lateral to each other. One structure is "directly laterally between" two other structures if the two structures are located on opposite sides of the one structure in a line that is parallel with a generally planar major side of the wafer. For example, in FIG. 1, region 137 is located directly laterally between regions 110 and 109. A surface is at a "higher elevation" than another surface, if that surface is located closer to the active side of a wafer in a line having a direction that is perpendicular with the generally planar major side of the wafer. In the views of FIGS. 1-7, the active side of the wafer is the top side.

Features specifically shown or described with respect to one embodiment set forth herein may be implemented in other embodiments set forth herein.

In one embodiment, A semiconductor device includes a substrate defining a trench. The trench including a sidewall and a bottom portion. The semiconductor device includes an emitter, a base and a collector. The collector including a portion located directly below the bottom portion of the trench and along the sidewall of the trench. The semiconductor device includes a collector contact structure and a collector silicide structure including a first portion located on at least a portion of the bottom portion of the trench and a second portion located on at least a portion of the sidewall of the trench. The collector silicide structure is electrically coupled to the collector contact structure.

In another embodiment, a method of forming a semiconductor device includes forming an emitter, a base, and a collector of a transistor. The method includes forming a trench in a semiconductor material and at least partially filling the trench with a dielectric material. The trench has a bottom portion and a sidewall of semiconductor material. At least a portion of the collector is located directly below the bottom portion of the trench. The method includes removing a portion of the dielectric material from the trench including a portion located directly over at least a portion of the bottom portion of the trench and along at least a portion of the sidewall of the trench to expose the semiconductor material. The method includes forming a collector silicide structure on the at least a portion of the bottom portion of the trench and on the at least a portion of the sidewall of the trench. The method includes forming a collective contact structure that is electrically coupled to the collector silicide structure.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor device comprising:
   a substrate defining a trench, the trench including a sidewall and a bottom portion;
   an emitter;
   a base;
   a collector, the collector including a portion located directly below the bottom portion of the trench and along the sidewall of the trench;
   a collector contact structure;
   a collector silicide structure including a first portion located on at least a portion of the bottom portion of the trench and a second portion located on at least a portion of the sidewall of the trench, the collector silicide structure being electrically coupled to the collector contact structure;

wherein the collector silicide structure is not located directly over a second portion of the bottom portion of the trench.

2. The semiconductor device of claim 1 wherein the collector contact structure electrically contacts a third portion of the collector silicide structure, the second portion of the collector silicide structure is located between the first portion and the third portion of the collector silicide structure.

3. The semiconductor device of claim 1 wherein the collector contact structure electrically contacts a portion of the collector silicide structure that is located outside of the trench.

4. The semiconductor device of claim 1 wherein the collector contact structure electrically contacts a portion of the collector silicide structure that is located on a portion of the substrate that is at a higher elevation than the bottom portion of the trench.

5. The semiconductor device of claim 1 wherein the collector includes a portion located directly under a portion of the base in a first area, wherein the first portion of the collector silicide structure is located laterally closer to the first area than the second portion of the collector silicide structure.

6. The semiconductor device of claim 5 wherein the portion of the base is located directly under the emitter.

7. The semiconductor device of claim 1 wherein the first portion of the collector silicide structure extends laterally closer to an area of an emitter electrode than the second portion of the collector silicide structure.

8. The semiconductor device of claim 1 wherein the collector silicide structure is in electrical contact with a plurality of regions of the collector where each region of the plurality of regions has a different net conductivity doping concentration of a first type.

9. The semiconductor device of claim 1 wherein the second portion of the collector silicide structure extends from the first portion of the collector silicide structure to a top portion of the at least a portion of the sidewall.

10. A semiconductor device comprising:
a substrate defining a trench, the trench including a sidewall and a bottom portion;
an emitter;
a base;
a collector, the collector including a portion located directly below the bottom portion of the trench and along the sidewall of the trench;
a collector contact structure;
a collector silicide structure including a first portion located on at least a portion of the bottom portion of the trench and a second portion located on at least a portion of the sidewall of the trench, the collector silicide structure being electrically coupled to the collector contact structure;
wherein the collector silicide structure is in electrical contact with a plurality of regions of the collector where each region of the plurality of regions has a different net conductivity doping concentration of a first type.

11. The semiconductor device of claim 10 wherein the collector contact structure electrically contacts a third portion of the collector silicide structure, the second portion of the collector silicide structure is located between the first portion and the third portion of the collector silicide structure.

12. The semiconductor device of claim 10 wherein the collector contact structure electrically contacts a portion of the collector silicide structure that is located outside of the trench.

13. The semiconductor device of claim 10 wherein the collector contact structure electrically contacts a portion of the collector silicide structure that is located on a portion of the substrate that is at a higher elevation than the bottom portion of the trench.

14. The semiconductor device of claim 10 wherein the collector includes a portion located directly under a portion of the base in a first area, wherein the first portion of the collector silicide structure is located laterally closer to the first area than the second portion of the collector silicide structure.

15. The semiconductor device of claim 14 wherein the portion of the base is located directly under the emitter.

16. The semiconductor device of claim 10 wherein the first portion of the collector silicide structure extends laterally closer to an area of an emitter electrode than the second portion of the collector silicide structure.

17. The semiconductor device of claim 10 wherein the second portion of the collector silicide structure extends from the first portion of the collector silicide structure to a top portion of the at least a portion of the sidewall.

* * * * *